United States Patent [19]

Dusserre et al.

[11] 4,197,273

[45] Apr. 8, 1980

[54] APPARATUS FOR CONTROLLING THE DIRECTIONAL SOLIDIFICATION OF A LIQUID-SOLID SYSTEM

[75] Inventors: Pierre Dusserre; Claude Potard, both of Saint-Egreve, France

[73] Assignee: Commissariat a l'Energie Atomique, Paris, France

[21] Appl. No.: 857,812

[22] Filed: Dec. 5, 1977

Related U.S. Application Data

[62] Division of Ser. No. 691,989, Jun. 2, 1976, Pat. No. 4,096,024.

[30] Foreign Application Priority Data

Jun. 11, 1975 [FR] France ................................ 75 18286
May 6, 1976 [FR] France ................................ 76 13551

[51] Int. Cl.² ............................................. B01J 17/08
[52] U.S. Cl. .................................... 422/248; 156/601;
156/616 R; 156/607; 156/622; 73/15 R; 73/3;
73/17 R; 73/296; 73/433; 73/437; 116/216;
116/217; 432/45; 356/372
[58] Field of Search .......... 422/248; 156/601, 617 SP,
156/620, 616 R, 616 A, 622; 116/217, 216;
432/45; 73/15, 296, 3, 16, 17 R, 433, 437, 290
R; 356/157

[56] References Cited

U.S. PATENT DOCUMENTS

| | | | |
|---|---|---|---|
| 1,800,532 | 4/1931 | Howard | 73/433 |
| 2,135,183 | 11/1938 | Junghans | 156/616 R |
| 2,908,004 | 10/1959 | Levinson | 156/601 |
| 3,459,152 | 8/1969 | Garrison | 156/601 |
| 3,791,887 | 2/1974 | Deitch | 156/622 |
| 3,822,111 | 7/1974 | Suzuki | 156/601 |
| 3,859,856 | 1/1975 | Keele | 116/217 |
| 3,879,235 | 4/1975 | Gatos | 156/622 |
| 3,934,983 | 1/1976 | Bardsley | 156/601 |
| 4,132,186 | 1/1979 | Manske | 116/216 |

FOREIGN PATENT DOCUMENTS

| | | | |
|---|---|---|---|
| 2313114 | 9/1974 | Fed. Rep. of Germany | 156/622 |
| 2449275 | 4/1975 | Fed. Rep. of Germany | 156/601 |
| 2266161 | 11/1975 | France | 73/433 |

OTHER PUBLICATIONS

Bardsley et al., Journal of Crystal Growth, 24/25, Mar. 1974, pp. 369–373.

*Primary Examiner*—Stephen J. Emery
*Attorney, Agent, or Firm*—Lane, Aitken & Ziems

[57] ABSTRACT

The growth of a solid obtained by cooling a liquid solution is observed and controlled by measuring the variation in volume of the solid-liquid system at the time of solidification. The method is applicable to the control of oriented crystallization from an initial crystal seed or epitaxial growth on a substrate having a suitable crystal orientation. The rate of crystallization can be controlled by means of a furnace provided with means for producing regulated thermal gradients, temperature-measuring means, a chamber filled with an inert liquid, an open-topped container filled with the liquid to be solidified and immersed in the inert liquid, the container being suspended from one arm of the beam of an electrobalance.

10 Claims, 10 Drawing Figures

APPARATUS FOR CONTROLLING THE DIRECTIONAL SOLIDIFICATION OF A LIQUID-SOLID SYSTEM

This is a division, of application Ser. No. 691,989 filed June 2, 1976, now U.S. Pat. No. 4,096,024.

This invention relates to a method for controlling the solidification of a liquid-solid system and especially a method for controlling the growth of a single-crystal layer in liquid phase. The invention is also concerned with a device for the practical application of the method in accordance with the invention.

As is already known, accurate measurement and control of liquid-solid transformation is necessary in order to obtain from the liquid state crystalline substances which have a high degree of structural perfection, that is, which have no defects such as twinning, crystal impurities or microprecipitates. Techniques of the prior art achieve these objectives only to a very partial extent since the phenomenon of crystallization is controlled only by means of approximate measurement of the range of temperatures within the sample (in a furnace of the Bridgman type, for example). Control of the liquid-solid transformation process can really be ensured only on the basis of measurement and control of an extensive quantity which is characteristic of said transformation or in other words directly related to the quantity of liquid which has solidified or crystallized in the course of time.

The direct observation of the limit between the liquid phase and the solid phase which can be performed by optical means satisfies the condition stated above but can clearly be employed only for transparent elements.

Similarly, gravimetric methods based on direct weighing of the solid immersed in the nutrient liquid phase or mother medium of different density, such methods having been described in the article by S. H. Smith and D. Elwell, Journal of Crystal Growth (3,4) (1968), page 471 which forms part of the description, result in extensive measurements; however, it has been possible by means of these methods to obtain only imprecise observations since there are a number of sources of error which affect the results of the measurements:

the real density of the displaced liquid is unknown since it remains a function of the concentration gradients, it is not possible to orient the crystal growth, which consequently gives rise to multidirectional growth with variable rates according to the crystal orientation of the interfaces, there remains the difficulty of eliminating the disturbances introduced by convection currents in the liquid.

The method in accordance with the invention overcomes the disadvantages discussed in the foregoing and makes it possible to measure an extensive quantity related to the liquid-solid transformation and applies to the oriented solidification of an extremely wide range of material, whether such material is of the congruent-fusion type or not.

The method according to the invention further permits of real and continuous control of the transformation process by either manual or automatic action.

More precisely, the method for controlling the solidification of a liquid-solid system in accordance with the invention essentially consists in observing the growth of the solid obtained by cooling a liquid solution by measuring the variation in volume of the solid-liquid system at the time of solidification.

One preferential application of the method according to the invention is the control of oriented crystallization in liquid phase which is carried out from an initial crystal seed or by epitaxial growth on a substrate having a suitable crystal orientation.

The method for controlling the crystal growth for example utilizes the continuous measurement of variations in volume of the liquid-solid system during the transformation process. These variations in volume are primarily due to the difference between the specific volume of the same substances in the solid state and in the liquid state: this is the molar volume of fusion $\Delta V_F$ in the case of pure substances or the difference in integral molar volumes in the case of mixtures.

Thus the quantitative determination of the crystallized (or solidified) mass as a function of time is possible when the molar volume of transformation of the material is known. Moreover, even if this quantity $\Delta V_F$ is unknown, the method in accordance with the invention makes it possible to show and thus to control any possible variations in the growth rate which are the cause of many structural defects of the crystallized solid.

The method in accordance with the invention also makes it possible to regulate the rate of crystallization by producing action on the temperature of the furnace in which the crystallization takes place as well as on the thermal gradients which exist within said furnace, as a function of the measurement of the growth rate of the solid in the liquid phase.

The advantages of the method of control arise from the very nature of the parameter being measured which is a characteristic extensive quantity of the phenomenon and therefore representative of the quantities transformed.

The measurement of the liquid volumes can be obtained with a high degree of accuracy by making use of conventional dilatometric techniques which are adapted to the experimental conditions of solidification. The sensitivity of these types of measurements makes it possible to detect micro-variations in speed of transformation or alternatively to control the thickness of a thin-film deposit in the case of deposition by epitaxial growth. The method in accordance with the invention is applicable both to the solidification of either pure or low-alloyed substances and to the solidification of binary or more complex concentrated mixtures.

In the two cases just mentioned, it is known that the variations in transformation volume are only slightly influenced by the progressive variation of concentrations in each of the two phases in the vicinity of the interface. On the contrary, the transformation temperature is an unknown factor since it is largely dependent on the measurement of the solidification rate, on the nature and concentration of the components in the vicinity of the interface. This phenomenon thus accounts for a further advantage of the method in accordance with the invention.

Similarly, the influence of the mean solidification rate which is laid down as a result of experience and modifies to a considerable extent the temperature of transformation by the phenomenon of kinetic undercooling remains imperceptible in regard to the molar volume of fusion.

Measurement of the variation in solid-liquid volume can be carried out in a preferential embodiment of the invention by immersing the solid-liquid system in an inert liquid and by measuring the variations in Archimedean thrust on the solid-liquid system, this variation in thrust being related to the variations in volume of said liquid-solid system. There is employed in this case an inert liquid having a lower density than that of the liquid to be crystallized.

In an alternative embodiment of the method according to the invention and in order to guard against parasitic variations in the volume of the solid-liquid system and of the enclosure containing said system which are essentially dependent on the temperature of the liquid melting bath, a preliminary calibration of said variations in volume is accordingly carried out. This preliminary calibration is performed under conditions which are as closely related as possible to those of the real solidification. Thus the variation in parasitic volume which is not related to a liquid-solid transformation can be associated with each value of the temperature and of a temperature gradient. Accordingly, said calibration or preliminary calibration makes it possible in respect of any temperature condition of the liquid bath to be crystallized to determine the variations in parasitic volume which can accordingly be deducted from the variations in volume to be observed so as to permit of accurate determination of the variations in real volume which relate to the solid-liquid transformation.

In more general terms, the method under consideration which is designated as a simulated differential method consists in measuring an elementary parameter on which the system depends and in interpreting said parameter independently of the transformation which takes place therein. Measurement of this elementary parameter (temperature, temperature gradient and so forth) is converted to an electrical quantity such that this latter can be set up in opposition at each instant to the voltage delivered by the volume-variation detector. The resultant signal is thus entirely freed from variations and parasitic fluctuations induced in the system by those of the parameter which is chosen. The elementary parameter or parameters are usually the temperature of the liquid bath or the temperature and gradient of the liquid bath to be solidified but can also be a vapor pressure, solubility, electrical or optical properties of the bath and so forth.

In the event that a number of parameters are observed, it is possible to study the action of each parameter independently, to check the corrections to be made in each of these parameters and, at the time of measurement of the variation in volume as a function of the different values of said parameters, to correct the variations in volume as measured by means of the different variations in parasitic volume in order to obtain the variations in real volume.

In the case of crystallization, the simulated differential method which eliminates the parasitic variations in volume of the sample makes it possible to measure small quantities of the transformation volume alone with the high degree of accuracy obtained by means of conventional dilatometric detectors, this being achieved without entailing any excessive increase in complexity of the equipment.

Two particularly important applications of the method of control are concerned in one case with massive monocrystallization from the liquid phase and in the other case with monocrystallization obtained by thin-film epitaxial growth from a saturated liquid phase.

Further properties and advantages of the invention will become more readily apparent from the following description of practical examples which are given by way of explanation and not in any limiting sense, reference being made to the accompanying drawings, wherein.

Figure 1:
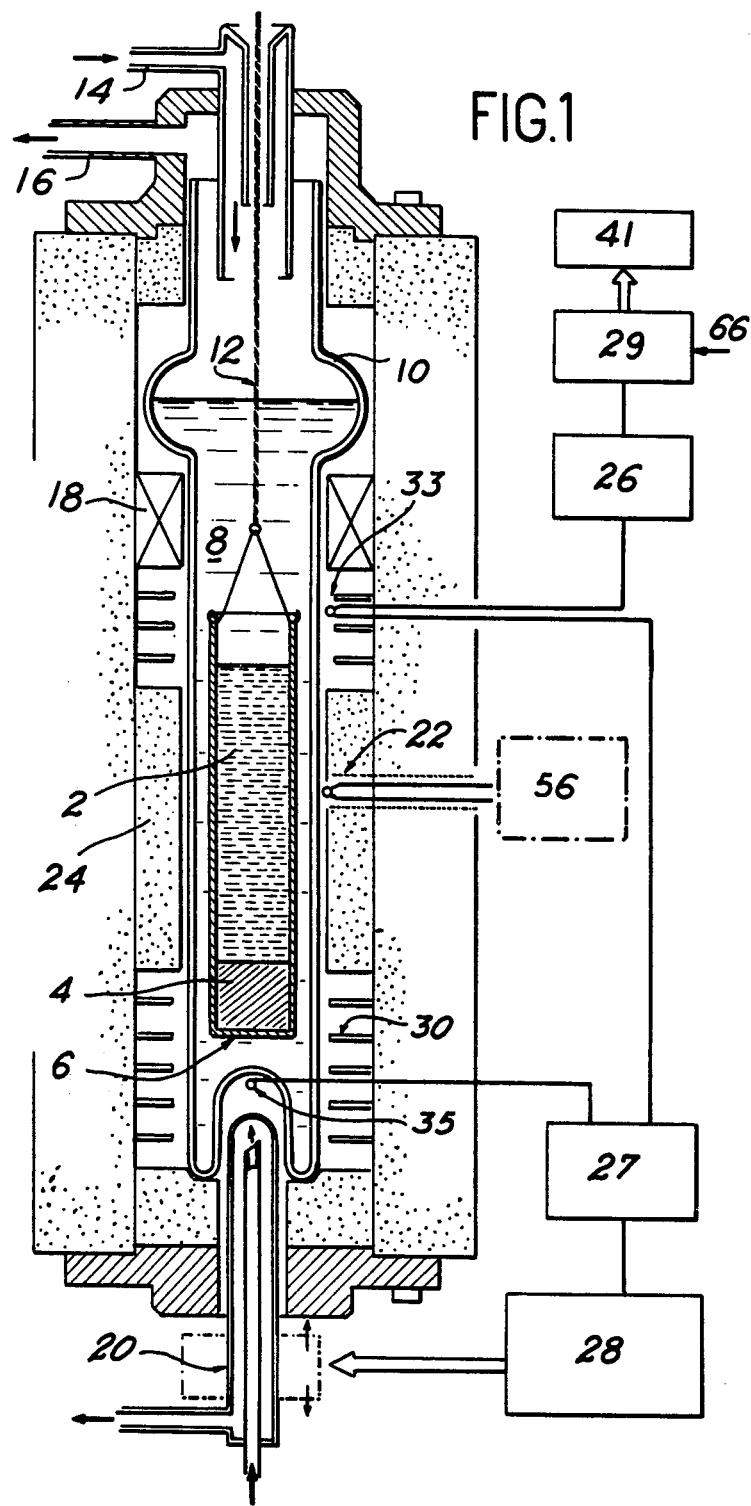
FIG. 1 shows the thermal portion of the device for the massive crystallization of a liquid and for the practical application of the invention.

The thermal portion of the massive crystallization device is shown in FIG. 1 makes it possible to obtain from a liquid solution 2 a crystal 4 which is crystallized from a seed deposited at the bottom of the container 6.

The open-topped container 6 is immersed in an inert liquid 8 contained in a vessel 10.

Figure 2:
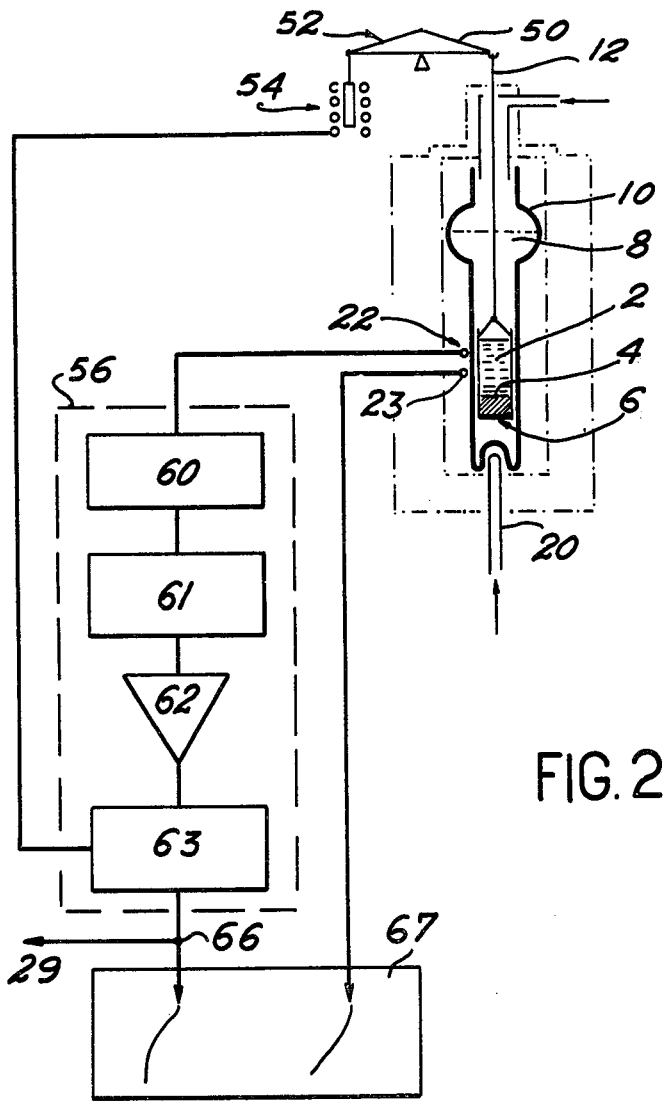
FIG. 2 shows the measuring and control portion of the massive crystallization device shown in FIG. 1.

The container 6 which is totally immersed in the liquid 8 is connected by means of the wire 12 to the end of one arm of the beam of an electrobalance which is shown in FIG. 2.

A circulation of gas through the ducts 14 and 16 makes it possible to renew the atmosphere which is present above the bath 8 of inert liquid.

The vessel 10 is placed within a tubular furnace of the Bridgman type; this vertical tubular furnace delivers a centripetal thermal flux; the axial thermal gradient is increased by means of a winding 18, the intended function of which is to overheat the upper portion of the immersion bath which is filled with inert fluid 8. The heat sink is constituted by a cooled probe 20 which is placed in the axis of the furnace at the lower end of this latter. The arrangement of the vessel 10 which contains the inert liquid 8 makes it possible to minimize the volume of fluid 2 in the liquid state in which the solid sample 4 is immersed while eliminating surface-active effects produced by the walls on the suspension wire 12 and the container 6.

The bottom portion of the reservoir in the shape of a glove finger makes it possible to increase the radial and axial thermal flux within the solid-liquid sample.

The temperature is measured by means of the thermocouple 22 in a zone which is close to the medium of the container 6. The thermocouple 22 is protected from external thermal influences by means of an inert mass 24 of refractory material. The thermocouple 22 is connected to a correcting unit 56 which is shown in greater detail in FIG. 2.

The thermal gradient which is continuously measured within the inert fluid 8 is maintained constant during the experiment by automatic regulation, this being performed by means of a regulator of known type fitted with a linear programmer 26 which controls the power in the hot region of the Bridgman furnace and which is well known to those versed in the art. Said programmer 26 controls a thermal regulator 29 which in turn controls the power source 41. A second regulator 28 associated with the differential comparator 27 for collecting the indications of the regulating thermocouples 33 and 35 produces action on the position of the cooling unit 20 in order to stabilize the value of the thermal gradient at a predetermined value.

A system of horizontal screens 30 has the effect of reducing the convective movements of the atmosphere around the vessel 10.

Measurement of the variations in volume of the two-phase solid-liquid system 2-4 which is present within the container 6 is carried out by gravimetry by converting the variations in volume to variations in Archimedean thrust on the container.

In the furnace of the Bridgman type shown in FIG. 1, the value of the thermal gradient and the power programming are adjusted so as to carry out solidification of the sample at different cooling rates.

The possibility of carrying out good measurement of the variations in volume of the liquid-solid system calls for very high hydrodynamic stability of the fluids 2 and 8 and also for cancellation by electrical opposition of the factors which influence the response of the balance other than that which resuts from liquid-solid transformation.

The first condition makes it necessary to establish values of thermal and mass flow which stabilize the fluid masses.

This condition which is undoubtedly favorable to monocrystallization in the Bridgman technique is satisfied by the application of the principle of the thermal core described in the article by Messrs. H. S. Carslaw and J. C. Jaeger, Conduction of Heat in Solids, The Clarendon Press, Oxford, 1967, this article being an integral part of the description. Thus a centripetal horizontal thermal flux and a downwardly oriented vertical axial flux are so applied that the condition of Rayleigh stability is maintained at all points of the fluid media.

The second condition is satisfied by adopting the simulated differential method.

The response of the balance during a crystallization operation is influenced by a certain number of phenomena: it is necessary to take account not only of the effects which are directly related to the existence of a transformation volume but also of major parasitic effects which are related to variations in density of the liquid, solid and even gaseous masses including the sample and the surrounding bath such as those produced by variations as a function of the temperature, positions and dimensions of the container and the suspension wire and also of surface tension forces.

This combination of parasitic factors is essentially dependent on the ranges of temperature within the device and on its variations.

A comparison of a measurement of temperature which is representative of the thermal state of the system at each instant with the indication supplied by the balance in the absence of any liquid-solid transformation shows the linearity and reversibility of the relation existing between these two quantities within the temperature range selected.

It will therefore be necessary only to convert the voltage delivered by the reference thermocouple 22 to another voltage which can be directly set up in opposition to that delivered by the electrobalance.

The use of the device for the practical application of the method according to the invention makes it possible to measure the variation and also to control the crystal growth rate (this factor governs the crystalline quality of the solid) by having recourse to methods of automatic control.

The method according to the invention offers the possibility of measuring the solidification rate as a function of time and also serves to control the thermal parameters in dependence on optimum fixed values in respect of the rate of solidification in solution.

A further possibility of use of the simulated differential method in accordance with the invention lies in the direct comparison of the growth rates of a sample with the growth rate of a standard reference. For example, it is possible to measure the effect of addition elements on the rate of growth of a sample.

The immersion bath must meet the known requirements of the methods of unidirectional crystallization, among which can be mentioned:

total relative insolubility of the liquid 8 and of the sample formed in the liquid 2 and the solid 4, density of the inert liquid 8 which is lower than that of the general container sample, high chemical inertia with respect to these elements in contact and high chemical purity, excellent wetting properties, low melting point and low vapor pressure, molten salt baths of the alkali metal chlorides in a eutectic composition, for example, are wholly suitable for metallic solid-liquid samples. Baths having a base of boric oxide can also be employed.

In FIG. 2, there is shown the electronic diagram in connection with the thermal-gradient furnace for controlling the crystallization of a solid-liquid system. The same elements in FIGS. 1 and 2 are designated by identical reference numerals.

The arm 50 of the beam of the electrobalance 52 is connected by means of the wire 12 to the container 6 in which the solid-liquid system is present. Measurement of the force applied to the wire 12 is obtained by compensation on the solenoid 54 of the other arm of the beam of the electrobalance 52.

The unit 56 comprises a function module 60, an opposition source 61, an amplifier 62 having a gain G and a differential connection unit 63. In this example of construction, a temperature measurement is performed by means of the thermocouple at 22 in the vicinity of the container 6. After amplification, the signal which has been processed by the function module acts in opposition to the signal produced by the electrobalance via channel 54. The signal on channel 66 at the output of the unit 56 is recorded in the recording unit 67 and the same applies to the signal obtained from a thermocouple 23 which is placed next to the thermocouple 22. After calibration, the signal on channel 66 measures the real growth of the solid 4 and can be employed for transmission into the unit 29 for regulating the growth rate as a result of regulation of the furnace temperatures.

The electrobalance 52 is a conventional "zero" instrument which delivers a voltage which is proportional to the variations in thrust. The signal obtained from the thermocouple 23 may simply be recorded in the unit 67.

The complete assembly consisting of container and liquid-solid sample must be in equilibrium with the immersion bath prior to commencement of any transformation process. This assembly must also be freed as far as possible of gas bubbles which adhere to the surfaces by capillary tension prior to establishment of a base line representing the variations in parasitic volume in the absence of an actual liquid-solid transition. In the case of seedless growth, the entirely liquid immersed sample as well as the bath are first placed in a vacuum in order to permit removal of the occluded gases. Under the initial conditions of the synthesis to be performed, a temperature stage is then maintained for the period of time which is necessary in order to establish equilibrium. The progressive variation of the system is followed by dilatometry and equilibrium is attained when the signal delivered by the detecting unit (52 and 56) to the channel 66 and recorded in the recording unit 67 no longer varies.

At the end of said temperature stage, the programmed cooling of the furnace obtained by the regulator 29 is resumed without thereby initiating the transformation of the sample. The opposition cirucit 61 which is incorporated in the unit 56 is calibrated so as to ensure that the base line is retained. Crystallization proper can then begin and is indicated by a corresponding progressive variation in the electrical output signal on channel 66 which is recorded in the recording unit 67.

A different method can also be adopted for establishing the base line; this method consists in carrying out adjustments during melting of the samples or dissolving of the solute. Any subsequent deviation from this line which may be observed during the reverse operation corresponds to an abnormality in the growth rate, this being due either to the mechanisms of attachment in the stationary state or to the various transient states which may in some cases occur.

Examples of process of crystal growth of an indium-antimony intermetallic compound:

(a) Physical characteristics of the compound melting temperature: $T_f = 530 \pm 5°$ C.

density of the solid: $\rho_S = 5.765 \ [1 - 1.643 \times 10^{-5} (T-530°)]$ density of the liquid:

This latter can be linearly related to the temperature by postulating a correlation factor which is equal to 0.995.

$$\rho_l = 6.470[1 - 1.0267 \times 10^{-4} (T-530)]$$

relative variation in volume at the time of fusion:

$$\Delta V_f / V_L = 12.3\%.$$

(b) Operating conditions container: tubular crucible of transparent quartz which contains the sample. This sample is constituted by a single-crystal seed which is attached mechanically to the base of the crucible and by a polycrystalline charge which is placed above the seed.

section: 1 cm²—height: 10 cm immersion bath: purified mixture of Li Cl - K Cl having the eutectic composition:

Melting point: 355° C.

Density of the liquid: $\rho_e = 1.70[1 - 3.105 \times 10^{-4} (T-355)]$

Suspension wire: 10% rhodium-platinum alloy having a diameter of 0.2 mm.

The thermal conditions have been defined in connection with two cases of synthesis. The first case corresponds to congruent solidification of the compound In Sb:

Mean temperature of the sample: 600° C.

Mean thermal gradient: 20° C./cm

Rate of programmed cooling: 15° C./hour.

The second case relates to the crystallization of the stoichiometric compound from a solution containing 64% by weight of indium, the liquid-solid equilibrium temperature of which is 500° C.

Mean temperature of the sample: 570° C.

Mean thermal gradient: 20° C.

Rate of programmed cooling: 0.6° C./hour.

(c) Measurements

Detection: the electrobalance employed offers a sensitivity of 0.121 mV/mg under these operating conditions.

Base line: the signal of the reference thermocouple is amplified with a gain of 2.330.

Drift of the base line is observed but remains constant and equal to 50 $\mu$V/hour. The variations observed do not exceed $\pm 2$ $\mu$V.

Under these conditions of measurement, it has been possible to follow the liquid-solid transformations in both cases with a sensitivity of 10 $\mu$V, which corresponds to a thickness of 5 $\mu$ of formed solid InSb.

In the simple case in which there is observed experimentally by calibration on the sample in the liquid state a linear variation in thrust as a function of temperature, the mathematical function which serves to modify the thermocouple signal is of the form: $E = A + B \ S_{TC}$, where E is the correction potential and $S_{TC}$ is the temperature signal delivered by the thermocouple 22.

There is then employed as shown in FIG. 2 an adjustable electric opposition source 61 for measuring the coefficient A and a variable-gain direct-current voltage amplifier 62 for obtaining the coefficient B of the formula given above.

In cases in which there is observed a non-linear variation in temperature caused by liquid alloys having a density which does not vary linearly with temperature (this being the case with tellurium-base alloys such as $In_2Te_3$, $Ga_2Te_3$, for example), processing of the thermocouple signal accordingly utilizes a mathematical function which is better adapted (polynomial, logarithmic function and so forth). This type of treatment of the signal clearly forms part of the device in accordance with the invention (function module of FIG. 2).

Figure 3:
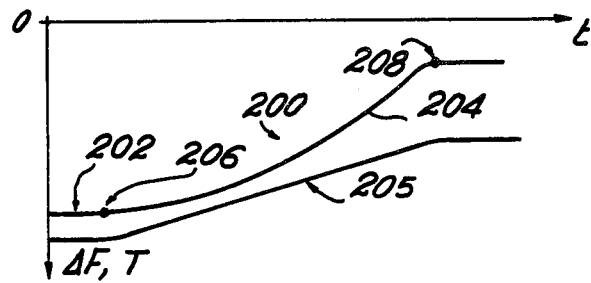
FIG. 3 shows the curves of time-dependent variations in volume and in temperature obtained by means of the device in accordance with the invention.

FIG. 3 shows at 200 the curve, recorded as a function of time, of the signal obtained on channel 26 of the diagram of FIG. 2 comprising the base line 202 and the corrected signal of resultant force $\Delta F$ 204 corresponding to solidification in the case of an InSb alloy. Solidification takes place between the points 206 and 208. The temperature curve 206 T(t) measured by means of the thermocouple 23 is also recorded as a function of time.

Figure 4A:
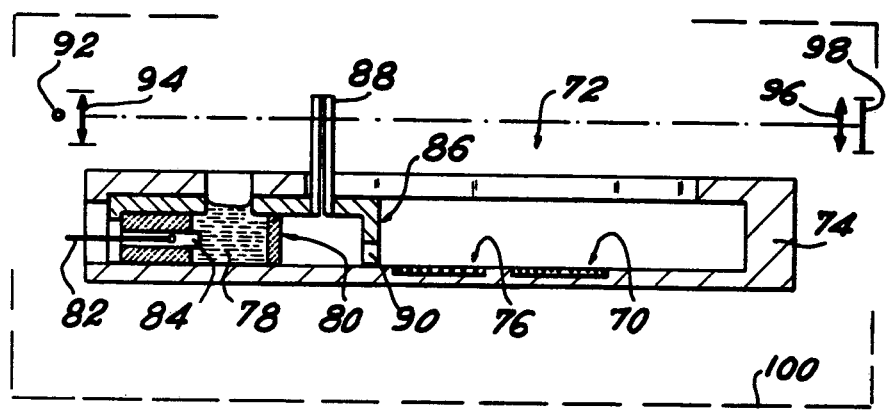
FIG. 4a is an epitaxial cell for making use of the method in accordance with the invention whilst

FIG. 4a shows an epitaxial growth cell and FIGS. 4b, 4c, 4d, 4e and 4f show the different stages of operation for the deposition of a layer by epitaxial growth on a substrate 70. The epitaxial-growth cell showed in FIG. 4a is employed for the formation of thin films by the method of horizontal epitaxy. The epitaxial-growth cell 4a is provided with sliding elements which permits chronological performance of the stages of operation shown in FIGS. 4b, 4c, 4d, 4e and 4f which will hereinafter be described. The epitaxial-growth cell 72 of the drawer type has been modified so as to conform to the conditions of detection of variations in volume. The cell 72 can be constructed of graphite or of any other chemically inert material which is both heat-resistant and capable of being machined with precision. The epitaxial-growth cell which is generally designated by the reference 72 has a parallelepipedal shape and consists of two main elements. One of these latter is a stationary element 74 which constitutes the cell body and in which two recesses are formed, the single-crystal substrate 70 being intended to be placed in one recess and a sample 76 employed as a source for saturating the solution 78 is placed in the other recess.

A moving system referred-to as a drawer is made up of three sections:

a main section 80 comprises the cavity which serves as a reservoir for the solution 78 and can be positioned with respect to the cell body. The capacity of said reservoir is accurately adjusted by displacing a dead space 84, this displacement being controlled from the exterior of the furnace 100. Three thermocouples 82 are placed within said dead space which is immersed in the solution during the epitaxial-growth stage. One of these thermocouples serves to regulate the furnace 100 which surrounds the epitaxial-growth cell. The second thermocouple serves to measure the mean temperature of the bath and the third thermocouple constitutes the reference element for the system of the simulated differential method.

the top portion of the drawer is a sliding plate 86 constituting a cover for the reservoir on which is fixed the capillary tube 88 of transparent quartz. An end-stop 90 permits the displacement of the plate 86.

Detection of the position of the meniscus within the capillary tube is obtained by means of an optical system constituted by a source 92, a first lens 94, a lens 96 and a system 98 for measuring the illumination produced by the lens 96 such as the sensitive surface of a photodetector, for example. The optical system forms the image of the meniscus located within the capillary tube 88 on the sensitive surface of the photoelectric cell 98. In order to prevent variations in the image as a result of convection currents of the furnace atmosphere which surrounds the cell, this optical sighting operation can be carried out through a transparent solid medium such as a quartz rod (not shown in the figure). The electrical signal at the output of the cell 98 is a function of all the factors which influence the position of the meniscus within the capillary tube 88. The simulated differential method consists in the case of deposition by epitaxy in generating in opposition to the signal A delivered by the photoelectric cell 98 another electrical signal B delivered by the reference thermocouple 82, this signal being proportional to the displacement of the meniscus independently of the liquid-solid transformation by epitaxial growth.

Thus in the absence of variations in volume resulting from the phase transformation, the two signals A and B remain equal and opposite during the recording which has been defined as the base line. When transformation takes place, namely either crystallization or dissolution, a difference appears which is proportional to the mass transformed.

Figure 4B:
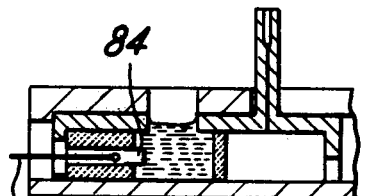
FIGS. 4b, 4c, 4d, 4e and 4f show the different stages of operation in the practical application of the method for obtaining crystal films by epitaxial growth.

The operating procedure is represented by the different stages in FIGS. 4b, 4c, 4d, 4e and 4f. FIG. 4b shows the degassing stage during which the cell filled with the single-crystal substrate of the saturation source and with the bath of predetermined composition containing if necessary a doping solute is placed in the vacuum-degassing position.

Figure 4C:
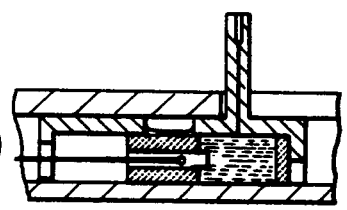

Adjustment of the base line shown at 202 in FIG. 3 is carried out in the position shown in FIG. 4c, namely the position of the drawer obtained after having adjusted the capacity of the reservoir 78 in order to bring the meniscus contained in the capillary tube 88 into its initial position. This adjustment takes place under a number of different temperature-variation regimes.

Figure 4D:
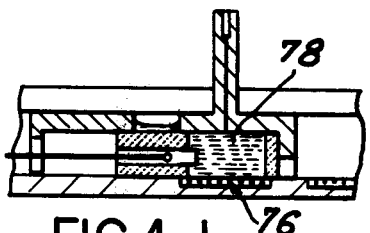

In the stage shown in FIG. 4d, the bath is brought to the initial temperature which was chosen and contacted with the solution 76 which is a source for the saturation of the solution 78. Contact between the solution 78 and the substrate 76 is maintained until a physico-chemical equilibrium between the solid and the liquid is established, this equilibrium being clearly observed by means of the system for detecting variations in volume. Homogeneity of the doping agent is obtained in the same liquid.

Figure 4E:
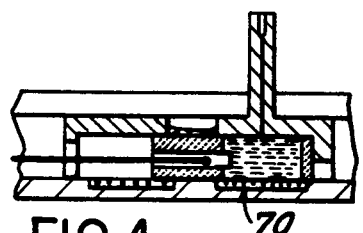

FIG. 4e shows the stage of deposition by epitaxy. The bath 78 which is saturated at the suitable initial temperature is placed in contact with the single-crystal substrate 70. If necessary, a re-adjustment of the physico-chemical equilibrium can be carried out before initiating the program of cooling of the furnace 100 which surrounds the cell. When crystallization begins, an optical signal appears and this latter is automatically converted to a signal which is proportional to the thickness of the deposit on the substrate 70.

Figure 4F:
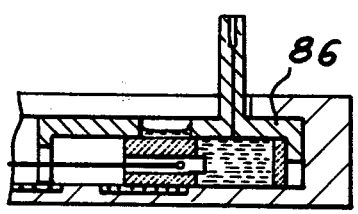

The end of the epitaxial growth operation is shown in FIG. 4f. Thus, when the thickness of the layer deposited on the substrate 70 attains a predetermined value, the drawer 86 is brought into the position shown in FIG. 4f in a movement of translation which causes sweeping of the surface of the layer deposited on the substrate 70, thus removing any excess quantity of solution. The complete drawer-type cell is then cooled to room temperature. In one example of execution, namely crystallization of the In-Sb compound in a thin film, deposition of a film is carried out from a solution containing 64% by weight of indium on a substrate having a surface area of 100 mm$^2$.

The cross-sectional area of the capillary tube 88 is 1 mm$^2$ and the unit for detecting the displacement of the meniscus permits measurement of a level different of $10^{-2}$ mm, namely a minimum volume variation of $10^{-2}$ mm$^3$. Taking into account the value of the melting volume of the compound, this corresponds to a value of $8 \times 10^{-}$mm$^3$ of solid formed at the surface of the substrate, namely a deposit having a theoretical thickness equal to 0.8 micron.

In the alternative embodiment which has just been described, the inert liquid in which the container is immersed sets temperature limitations which may prove objectionable and entails the need for chemical compatibilities between the elements in mutual contact and the elements used as contaminants for the crystal which is being formed. Furthermore, the container for the liquid-solid system is entirely supported by the beam of the electrobalance; the variations in Archimedean thrust thus relate to the entire weight of the container and this is liable to affect the sensitivity of the balance since this latter is subjected to a fairly substantial weight.

In another alternative embodiment which will now be described, the disadvantages mentioned in the foregoing are overcome by dispensing with the inert liquid and concurrently increasing the accuracy of the measurement.

In the second alternative embodiment, control of the solidification of a two-phase liquid-solid system essentially consists in determining the variation in volume related to the solid-liquid transformation by partially immersing in the liquid phase a plunger which is maintained in a substantially stationary position, in then measuring the variations in Archimedean thrust on said stationary plunger with respect to the container which is also stationary; the variations in Archimedean thrust are due to the variations during solidification in the level of the liquid which is present above the crystal;

these variations in level of the liquid result from the differences between the specific weights of the liquid and of the solid which are transformed one into the other during crystallization.

The plunger employed has a regular shape and especially a cylindrical shape with calibrated dimensions, a density which is higher than the density of the liquid undergoing crystallization and is supported by a wire attached to one of the arms of the beam of an electrobalance. It is readily apparent that the weight of the plunger is independent of the quantity of crystal to be formed, which was not the case in the embodiment described in the main patent. Thus only the resultant weight in relation to the depth of an immersion of the plunger and therefore to the quantity of crystal formed is recorded by the electrobalance.

The method which relates to the device in accordance with this second alternative embodiment applies to all methods of solidification of a mixture (growth of homogeneous crystals) wherein the stationary container in which the solid-liquid system is present during crystallizaton is placed within a furnace which is maintained at a constant temperature gradient by regulating means or any other suitable means and which is programmed so as to permit of controlled cooling.

Figure 5:
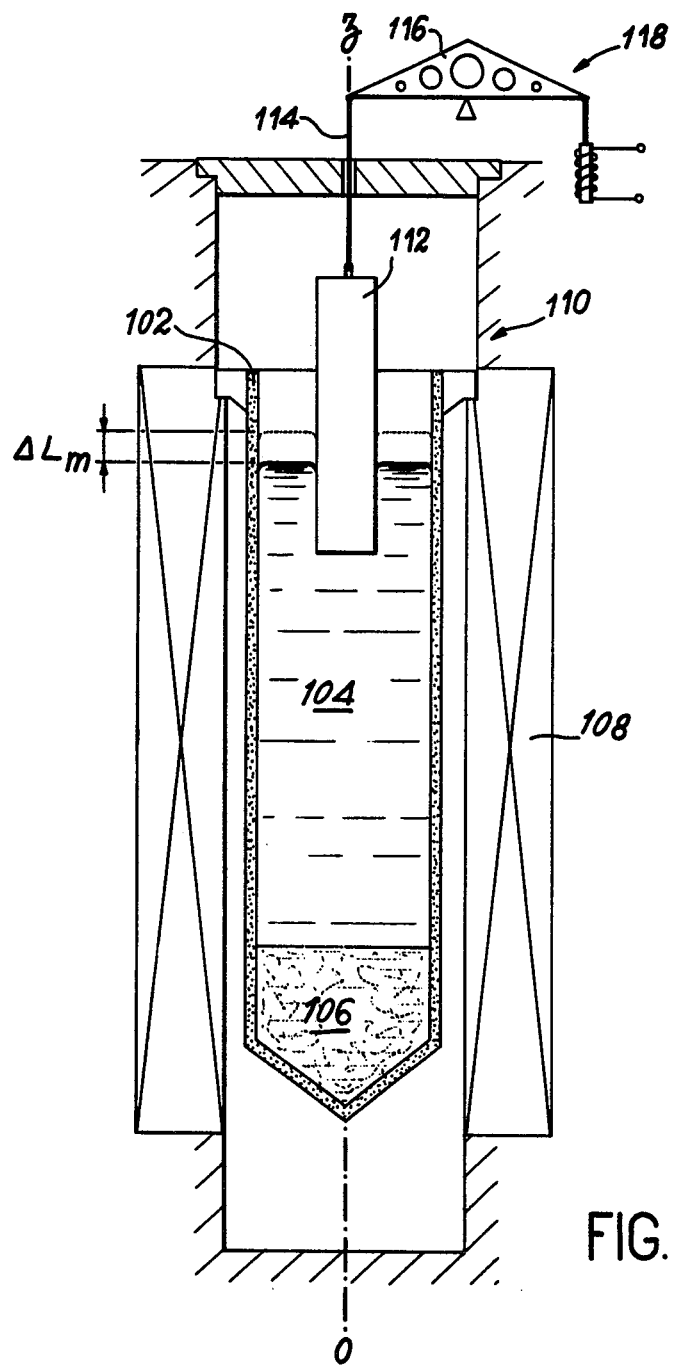
FIG. 5 shows a second alternative embodiment of the invention.

In FIG. 5, the container 102 is filled with a liquid 104 which crystallizes so as to form the crystal 106 under the influence of a temperature gradient (not shown) which is obtained in a conventional manner under the influence of heating means 108, said heating means being programmed electrically so as to produce a variation in the falling temperatures as a function of time. A heat-resistant casing 110 surrounds the temperature-gradient furnace together with its electrical heating means 108 and isolates said furnace from the exterior. A plunger 112 is partially immersed in the liquid bath 104 which is the bath of liquid to be crystallized; the plunger is suspended by means of the wire 114 on the beam 116 of an electrobalance 118.

The plunger 112 and the container 102 are maintained in a stationary position by means which are related to the principle of operation of the electrobalance (zero instrument). After preliminary adjustment and balancing of the current within the electrobalance in respect of a predetermined position of the plunger, a measurement is taken of the variations in Archimedean thrust caused by the variations $\Delta L_m$ in the level of the surface of the liquid within the container during crystallization. This measurement of Archimedean thrust makes it possible to follow the growth of the crystallization process. As in the first alternative embodiments, the parasitic forces (capillary tension, variation in thrust due to the variation in mean density of the liquid, variation in dimensions of the plunger and of the container and so forth) are eliminated by the use of the differential method.

The respective cross-sections of the crucible and of the plunger can be chosen in order to produce a predetermined amplitude of the measured Archimedean thrust and therefore to achieve enhanced accuracy. This advantage can be shown by the following simplified formula: $\Delta L_m = \Delta V / S\text{-}s$ which indicates that, in the case of a variation in volume of the sample $\Delta V$ resulting from modification of part of the liquid, the variation in thrust which is directly proportional to the variation in measured depth of immersion $\Delta L_m$ will be greater as the cross-section s of the plunger comes closer to that of the crucible S.

As mentioned in the foregoing, the load applied to the beam of the electrobalance is essentially the weight of the plunger 112 reduced by the Archimedean thrust over the immersed depth and not, as in the device shown in FIG. 1, the weight of the solid-liquid container assembly reduced by the Archimedean thrust exerted by the inert liquid which surrounds said assembly.

What we claim is:

1. Apparatus for controlling the directional solidification of a two-phase liquid-solid system wherein the solidification is by cooling of and occurs in the liquid phase, said apparatus comprising:
    a container for holding the liquid-solid system;
    heating means for producing a thermal gradient of regulated value within said container;
    means for measuring variations in the volume of the liquid-solid system resulting from changes in molar volume due to transfer between liquid and solid phases in the system during the solidification; and
    means for regulating said thermal gradient responsive to said measured variations in the volume of the liquid-solid system.

2. Apparatus for controlling the directional solidification of a two-phase liquid-solid system wherein solidification is by cooling of and occurs in the liquid phase, said apparatus comprising:
    a first open container for holding an inert liquid;
    heating means for producing a thermal gradient of regulated value within said first container;
    a second open container containing the liquid to be solidified, said second container being immersed in the inert liquid of said first container, the inert liquid and the upper surface of the liquid to be solidified being in contact;
    means for measuring variations in the apparent weight of said second container and its contents, said variations in apparent weight being due to changes in buoyancy of the second container and its contents resulting from changes in the volume of its contents which occur during mass transfer from the liquid phase to the solid phase during solidification; and
    means for regulating said thermal gradient responsive to said measured variations in apparent weight.

3. The apparatus of claim 2 wherein said means for measuring variations in apparent weight is an electrobalance.

4. The apparatus of claim 3 wherein said means for measuring variations in the apparent weight delivers a first electrical signal and wherein said means for regulating said thermal gradient comprises means for measuring temperature and delivering a second electrical signal representative of said temperature and means for comparing said first and second electrical signals.

5. Apparatus for controlling the epitaxial growth of a solid, from liquid phase, on a crystalline substrate, said apparatus comprising:
    an elongated housing;
    a pair of elements slidably mounted within said housing and defining a space therebetween for containing the liquid;
    at least one recess in said housing for holding the crystalline substrate for contact with the liquid;
    a capillary tube mounted on said housing, the lower end of said capillary tube opening into the interior of said housing for communication with said liquid containing space;

means for measuring variations in the level of the liquid meniscus in said capillary resulting from charges in volume of the contents of space which occur during mass transfer from the liquid phase to the solid phase during solidification on the substrate; and heating means for controlling the temperature within said housing responsive to said measured variations in meniscus level.

6. The apparatus of claim 5 wherein said means for measuring variations in the miniscus level delivers a first electrical signal and wherein said means for controlling temperature comprises means for measuring temperature and delivering a second electrical signal representative of said temperature and means for comparing said first and second electrical signals.

7. Apparatus for controlling the directional solidification of a two-phase liquid-solid system wherein solidification is by cooling of and occurs in the liquid phase, said apparatus comprising:

an open container for holding the liquid undergoing solidification;

a plunger having a density greater than that of the liquid and means for suspending the plunger in a stationary position partially immersed in the liquid:

means for measuring variations in the apparent weight of siad plunger due to changes in the bouyant force of the liquid on the stationarily positioned plunger produced by changes in liquid level, said changes in liquid level resulting from changes in the volume which occur during mass transfer from the liquid phase to the solid phase during solidification; and heating means for controlling the temperature within said container responsive to said measured variations in apparent weight.

8. The apparatus of claim 7 wherein said plunger is cylindrical.

9. The apparatus of claim 7 wherein said means for measuring changes in apparent weight is an electro-balance from one arm of which the plunger is suspended.

10. The apparatus of claim 7 wherein said means for measuring variations in the apparent weight delivers a first electrical signal and wherein said heating means comprises means for measuring temperature and delivering a second electrical signal representative of said temperature and means for comparing said first and second electrical signals.

* * * * *